US008487652B2

(12) United States Patent
Yap et al.

(10) Patent No.: US 8,487,652 B2
(45) Date of Patent: *Jul. 16, 2013

(54) ADJUSTABLE INTERFACE BUFFER CIRCUIT BETWEEN A PROGRAMMABLE LOGIC DEVICE AND A DEDICATED DEVICE

(75) Inventors: Ket-Chong Yap, San Ramon, CA (US); Senani Gunaratna, Los Gatos, CA (US); Wilma Waiman Shiao, San Jose, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 32 days.

This patent is subject to a terminal disclaimer.

(21) Appl. No.: 13/212,522

(22) Filed: Aug. 18, 2011

(65) Prior Publication Data

US 2011/0298492 A1    Dec. 8, 2011

Related U.S. Application Data

(63) Continuation of application No. 11/525,275, filed on Sep. 21, 2006, now Pat. No. 8,018,248.

(51) Int. Cl.
*H03K 19/173* (2006.01)
(52) U.S. Cl.
USPC ................ 326/38; 326/39; 326/41; 326/83
(58) Field of Classification Search
USPC ............................................. 326/37–41, 47
See application file for complete search history.

(56) References Cited

U.S. PATENT DOCUMENTS

| | | | |
|---|---|---|---|
| 5,825,202 A * | 10/1998 | Tavana et al. | 326/39 |
| 5,900,742 A | 5/1999 | Kolze et al. | |
| 6,130,553 A | 10/2000 | Nakaya | |
| 6,292,021 B1 * | 9/2001 | Furtek et al. | 326/41 |
| 6,552,410 B1 * | 4/2003 | Eaton et al. | 257/530 |
| 6,791,353 B1 | 9/2004 | Beal et al. | |
| 6,992,503 B2 * | 1/2006 | Madurawe | 326/39 |
| 7,304,497 B2 | 12/2007 | Phoon et al. | |
| 7,389,487 B1 * | 6/2008 | Chan et al. | 716/50 |
| 7,446,562 B2 * | 11/2008 | Nomura et al. | 326/41 |
| 7,679,399 B2 * | 3/2010 | Madurawe | 326/38 |
| 8,018,248 B2 | 9/2011 | Yap et al. | |
| 2001/0052793 A1 * | 12/2001 | Nakaya | 326/41 |

OTHER PUBLICATIONS

Office Action mailed on Jan. 28, 2008 for U.S. Appl. No. 11/525,275, filed Sep. 21, 2006, by Yap et al., 15 pages.

(Continued)

*Primary Examiner* — Shawki Ismail
*Assistant Examiner* — Christopher Lo
(74) *Attorney, Agent, or Firm* — Silicon Valley Patent Group LLP

(57) ABSTRACT

An integrated circuit includes a programmable logic device, a dedicated device, and an interface circuit between the two. The interface circuit can be easily modified to accommodate the different interface I/O demands of various dedicated devices that may be embedded into the integrated circuit. In one embodiment, the interface circuit may be implemented using a plurality of mask programmable uni-directional interface buffer circuits. The direction of any desired number of the interface buffer circuits can be reversed based on the needs of a desired dedicated device by re-routing the conductors in the interface buffer circuits in a single metal layer of the integrated circuit. In another embodiment, the interface circuit may be implemented using a hardware configurable bi-directional interface buffer circuit.

7 Claims, 4 Drawing Sheets

OTHER PUBLICATIONS

Response to Office Action mailed on Apr. 21, 2008 for U.S. Appl. No. 11/525,275, filed Sep. 21, 2006, by Yap et al., 9 pages.
Office Action mailed on Jul. 9, 2008 for U.S. Appl. No. 11/525,275, filed Sep. 21, 2006, by Yap et al., 17 pages.
Response to Office Action mailed on Oct. 9, 2008 for U.S. Appl. No. 11/525,275, filed Sep. 21, 2006, by Yap et al., 15 pages.
Office Action mailed on Feb. 5, 2009 for U.S. Appl. No. 11/525,275, filed Sep. 21, 2006, by Yap et al., 14 pages.
Response to Office Action mailed on Apr. 30, 2009 for U.S. Appl. No. 11/525,275, filed Sep. 21, 2006, by Yap et al., 10 pages.
Office Action mailed on Aug. 18, 2009 for U.S. Appl. No. 11/525,275, filed Sep. 21, 2006, by Yap et al., 8 pages.
Response to Office Action mailed on Nov. 18, 2009 for U.S. Appl. No. 11/525,275, filed Sep. 21, 2006, by Yap et al., 9 pages.
Final Office Action mailed on Mar. 1, 2010 for U.S. Appl. No. 11/525,275, filed Sep. 21, 2006, by Yap et al., 11 pages.
Pre-Brief Conference request mailed on May 28, 2010 for U.S. Appl. No. 11/525,275, filed Sep. 21, 2006, by Yap et al., 6 pages.
Pre-Brief Appeal Conference decision mailed on Sep. 10, 2010 for U.S. Appl. No. 11/525,275, filed Sep. 21, 2006, by Yap et al., 2 pages.
Office Action mailed on Nov. 24, 2010 for U.S. Appl. No. 11/525,275, filed Sep. 21, 2006, by Yap et al., 7 pages.
Response to Office Action mailed on Feb. 16, 2011 for U.S. Appl. No. 11/525,275, filed Sep. 21, 2006, by Yap et al., 11 pages.
Applicant Summary of Interview mailed on May 5, 2011 for U.S. Appl. No. 11/525,275, filed Sep. 21, 2006, by Yap et al., 1 page.
Examiner Interview Summary Record mailed on May 9, 2011 for U.S. Appl. No. 11/525,275, filed Sep. 21, 2006, by Yap et al., 3 pages.
Notice of Allowance mailed on May 12, 2011 for U.S. Appl. No. 11/525,275, filed on Sep. 21, 2006, by Yap et al., 12 pages.

* cited by examiner

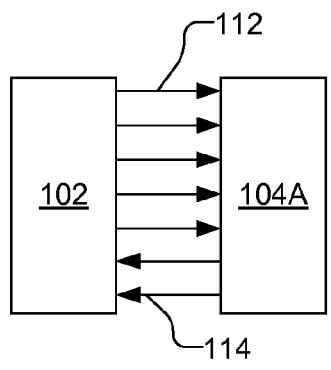
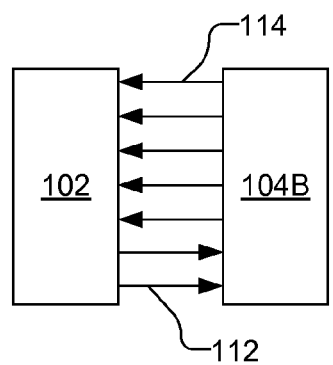
Fig. 3A    Fig. 3B
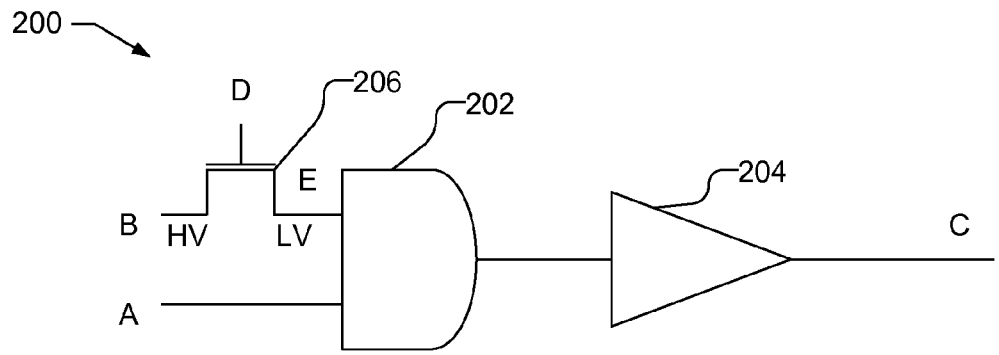
Fig. 4A
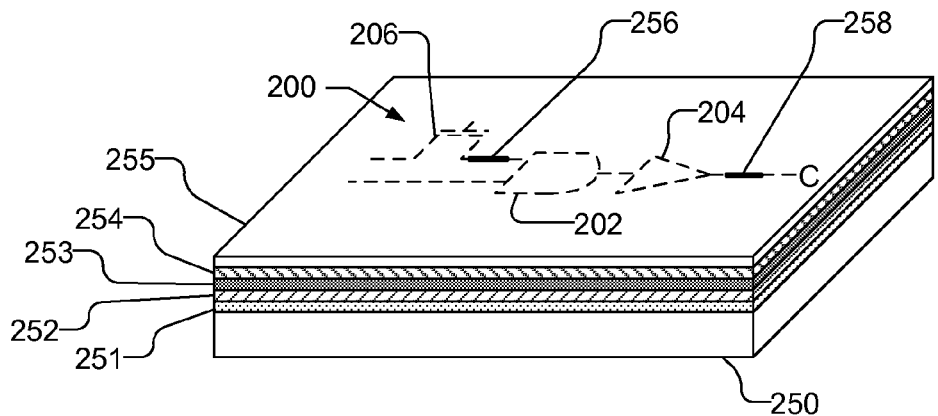
Fig. 4B

ADJUSTABLE INTERFACE BUFFER CIRCUIT BETWEEN A PROGRAMMABLE LOGIC DEVICE AND A DEDICATED DEVICE

CROSS REFERENCE TO RELATED APPLICATION

This application is a continuation of U.S. Ser. No. 11/525,275, filed Sep. 21, 2006, which is incorporated by reference herein in its entirety.

FIELD OF THE INVENTION

The present invention relates to an integrated circuit that includes a programmable logic device, such as a field programmable gate array, a dedicated device such as an ASIC type device, and an interface for communication between the programmable logic and dedicated devices.

BACKGROUND

The semiconductor industry is driven with a desire to provide higher levels of integration. With higher levels of integration, silicon space and cost are reduced while performance and reliability are increased. Unfortunately, higher levels of integration lead to greater specificity. For example, application specific integrated circuits (ASICs) are highly specific devices that often serve the needs of only one customer.

Programmable logic devices, such as field programmable gate arrays (FPGAs), are versatile integrated circuit chips, which have internal circuitry logic with user selected connections that a user can configure to realize user-specific functions. While programmable logic is versatile, there are significant design challenges in size, routing, pin-out stability when mapping large complex functions onto a silicon platform containing programmable logic.

While programmable logic devices may be linked with separate dedicated devices, i.e., off chip devices, there are associated on/off chip delays, large board area, and high cost. Further, while programming a programmable logic to perform the desired function is possible, this is an expensive proposition and the resulting performance is often not acceptable.

Placing a programmable logic device on the same chip as a dedicated device is desirable as it eliminates the need for an off-chip interface with its associated delays, large board area and high cost. Nevertheless, placing a programmable logic device on the same chip as a dedicated device still requires an interface circuit between the devices. While a programmable logic device design may be used with different dedicated device designs, often the interface circuit between the devices must undergo an expensive and time consuming redesign depending on the input/output (I/O) interface demands of the dedicated device. Accordingly, an improved interface is desired.

SUMMARY

An interface circuit that can be modified to accommodate the different interface I/O demands of various dedicated devices is used with an integrated circuit that includes a programmable logic device and a dedicated device. In one embodiment, the interface circuit may be implemented using a plurality of mask programmable uni-directional interface buffer circuits. The direction of any desired number of the interface buffer circuits can be reversed based on the needs of a desired dedicated device by re-routing the conductors in the interface buffer circuits in a single metal layer of the integrated circuit. In another embodiment, the interface circuit may be implemented using a hardware configurable bi-directional interface buffer circuit.

BRIEF DESCRIPTION OF THE DRAWINGS

FIGS. 3A and 3B schematically illustrate how the I/O interface demands of one dedicated device may differ from another dedicated device.

FIG. 4A illustrates a single mask programmable uni-directional interface buffer circuit.

FIG. 4B is an illustration of a portion of an integrated circuit that includes the interface buffer circuit of FIG. 4A formed from a semiconductor chip covered with a plurality of patterned layers.

DETAILED DESCRIPTION

Figure 1:
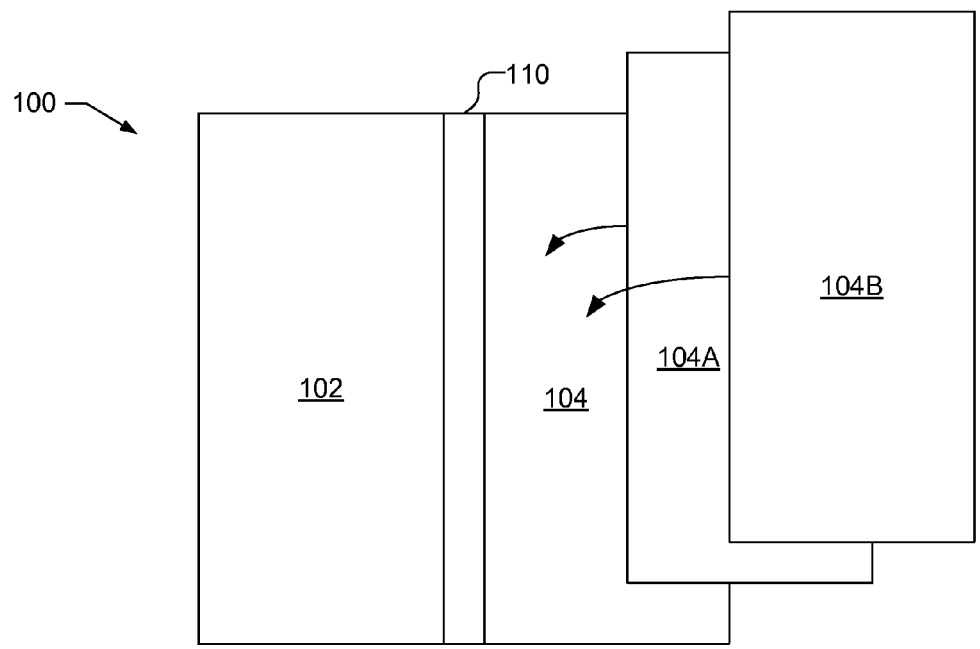
FIG. 1 is a schematic view of an integrated circuit that includes programmable logic device, dedicated device, and an interface circuit between the two.

FIG. 1 is a schematic view of an integrated circuit 100 that includes programmable logic device 102 and dedicated device 104, each of which has I/O pins (not shown) for connection to external circuitry. An interface circuit 110, in accordance with an embodiment of the present invention, connects the programmable logic device 102 to the dedicated device 104. Integrated circuit 100 may be thought of as a programmable logic device with the dedicated device 104 "embedded" onto the same chip. Programmable logic device 102 is, for example, a field programmable gate array (FPGA) or other circuitry having user programmable circuit connections, while dedicated device 104 is a fixed circuit implementing a desired function. For example, dedicated device 104 may be an application specific circuit that performs a function such as creating an interface with an industry standard bus. Advantageously, integrated circuit 100, with programmable logic device 102 and dedicated device 104 connected through interface circuit 110, provides a user with the guaranteed functionality, ease-of-use, and high performance found in a dedicated device, such as an ASIC, as well as the configurability and flexibility found in programmable logic.

Figure 2:
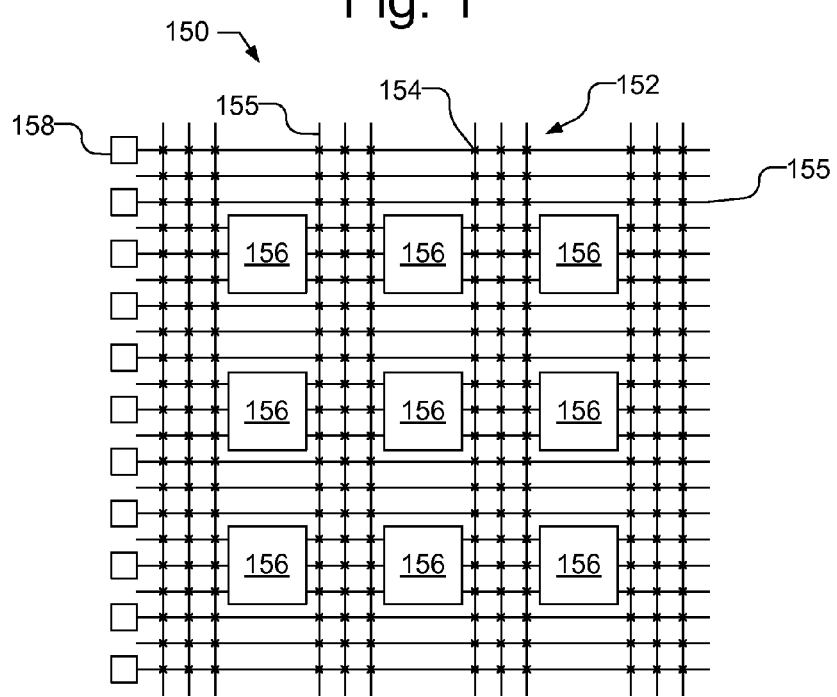
FIG. 2 illustrates a simplified schematic of a programmable logic device, in the form of an FPGA device, that may be used as the programmable logic device of FIG. 1.

FIG. 2 illustrates a simplified schematic of a programmable logic device 150, in the form of an FPGA device, that may be used as the programmable logic device 102 of FIG. 1. While the programmable logic device 102 is described herein as FPGA 150, it should be understood that other alternative types of programmable logic device may be used, such as simple and complex PLDs, SPLDs/PALs, and CPLDs. The FPGA device 150 includes an array 152 of programmable elements, such as antifuses 154 represented by the "X" symbol and conductors 155. The antifuses are used to selectively connect one conductor 155 with another. Antifuses 154 may be, for example, amorphous silicon antifuses or other suitable antifuse structures, such as oxide-nitride-oxide antifuses, such as that described in U.S. Pat. Nos. 5,424,655; 5,502,315; and 5,557,136, which are incorporated herein by reference. The array 152 of programmable elements, which is sometimes referred to as a programmable fabric, is connected to a number of logic blocks 156. Each logic block 156 contains a number of logic elements, which can be selectively combined to perform a desired function through the appropriate interconnection of conductors 155 via the antifuses 154. Input/output (I/O) circuits 158 provide an interface to external circuitry, i.e., off-chip circuitry. The operation of the programmable logic device 150 as shown in FIG. 2 is similar to that described in U.S. Pat. No. 5,825,201 entitled "Programmable Architecture for a Programmable Integrated Circuit Employing Antifuses" which is incorporated herein by reference.

As illustrated in FIG. 1, the integrated circuit 100 may be implemented with different dedicated devices 104A and 104B by embedding the desired dedicated device 104A or 140B onto the chip in place of dedicated device 104. However, each dedicated device 104, 104A, and 104B may have different interface I/O demands.

FIGS. 3A and 3B schematically illustrate how the I/O interface demands of one dedicated device 104A may differ from another dedicated device 104B. As illustrated in FIG. 3A, a dedicated device 104A may require X number of input signals 112 and Y number of output signals 114 to and from the programmable logic device 102. The dedicated device 104B, shown in FIG. 3B, however, may require Y number of input signals 112 and X number of output signals 114 to and from the programmable logic device 102. Of course, different dedicated devices may require completely different numbers of input signals 112 and output signals 114.

Accordingly, the interface circuit 110 shown in FIG. 1 is designed to be easily modified to accommodate the different interface I/O demands of various dedicated devices that may be embedded into the integrated circuit 100.

In one embodiment, the interface circuit 110 is implemented as a mask programmable uni-directional interface. FIG. 4A illustrates a single interface buffer circuit 200 in accordance with such an embodiment. It should be understood that the interface circuit 110 includes a plurality of interface buffer circuits 200. Interface buffer circuit 200 includes logic gate 202 and a buffer 204. Logic gate 202 is illustrated as an AND logic gate, and is therefore sometimes referred to herein as AND logic gate 202. It should be understood, however, that the logic gate 202 may be any desired type of logic gate, including but not limited to an OR, NOT, NAND NOR, XOR and XNOR gates or some combination of gates to perform any desired logic function. The buffer 204 may be, e.g., an inverting or non-inverting buffer. The input terminals of the AND logic gate 202 are connected to the programmable logic device 102 at nodes A and B, and the output terminal of the buffer 204 is connected to the dedicated device 104 at node C.

Node A carries a control signal that is used to disable the functionality of the interface buffer circuit 200. Node B carries the output signal from the programmable fabric of the programmable logic device 102 and may be connected to the AND logic gate 202 through a switch 206. The switch 206, which may be, e.g., an NMOS transistor, PMOS transistor, JFET transistor, transmission gate transistor or any other appropriate type of switching device, is disposed between node B and node E and node E is connected to one of the input terminals of the AND logic gate 202, thereby providing the output signal from the programmable logic device 102 to the AND logic gate 202. The switching terminal, node D, of switch 206, carries a control signal for turning switch 206 on and off, thereby enabling the interface buffer circuit 200. The switching terminal, node D, of switch 206 may be coupled to the programmable logic device, which is represented illustratively in FIGS. 6A and 6B, and in one embodiment is controlled by programmable or unprogrammable logic within the programmable logic device 102.

The interface buffer circuit 200, shown in FIG. 4A, is used throughout the interface circuit 110 between the programmable logic device 102 and the dedicated device 104. In other words, the interface circuit 110 between programmable logic device 102 and the dedicate device 104 includes a number of interface buffers 200, each acting as a separate interconnection between the programmable logic device 102 and the dedicate device 104. It should be understood that interface buffer circuit 200, as illustrated in FIG. 4A, is a unidirectional interface supplying the output signals from the programmable logic device 102 to the dedicate device 104.

Through a small modification of the routing path of the conductors in a single layer of the integrated circuit, the same basic interface buffer circuit 200 may be used as a unidirectional interface supplying the output signals from the dedicate device 104 to the programmable logic device 102. As is well known in the art, integrated circuits are commonly implemented by forming a plurality of patterned layers of various materials, metals, dielectrics, etc. over a semiconductor wafer and dividing the wafer into chips having the formed integrated circuit. FIG. 4B is an illustration of a portion of an integrated circuit that includes the interface buffer circuit 200 formed from a semiconductor chip 250 covered with a plurality of layers 251, 252, 253, 254 and 255, which may be formed of various materials such as metals, metal alloys, dielectrics, etc and are patterned to form the interface buffer circuit 200. The interface buffer circuit 200 is illustrated schematically in FIG. 4B and the dotted lines are to indicate that the circuit is formed in underlying layers 251, 252, 253, and 254. The top layer 255 is illustrated with two conductors 256 and 258. It should be understood, of course, that FIG. 4B is merely for illustrative purposes and that the interface buffer circuit 200 can be formed of layers below, above, and including layer 255. The routing path of conductor 256 in layer 255 is used to electrically connect the switch 206 to the AND logic gate 202 and the routing path of conductor 258 is used to electrically connect the buffer 204 to node C, which is connected to the dedicated device. In accordance with an embodiment of the present invention, only layer 255 in the integrated circuit needs to be modified to reverse the connection of the interface buffer circuit 200.

Figure 5A:
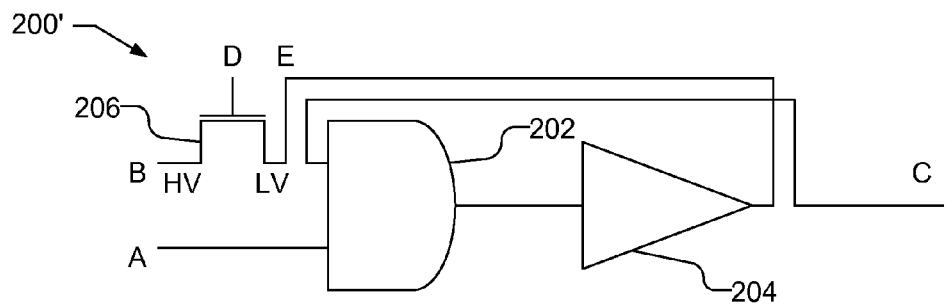
FIG. 5A illustrates the interface buffer circuit of FIG. 4A which is reversed in direction.

FIG. 5A illustrates an interface buffer circuit 200', which is the same as interface buffer circuit 200 shown in FIG. 4A (like designated elements being the same), except the interconnection of nodes C and E are rearranged. As illustrated in FIG. 5A, node C of the dedicated device 104 is connected to one of the input terminals of the AND logic gate 202, and the output terminal of the buffer 204 is connected to the switch 206 at node E, and thus, is connected to the programmable logic device 102 at node B via switch 206. Accordingly, interface buffer circuit 200' is a unidirectional interface supplying the output signals from the dedicate device 104 to the programmable logic device 102.

Figure 5B:
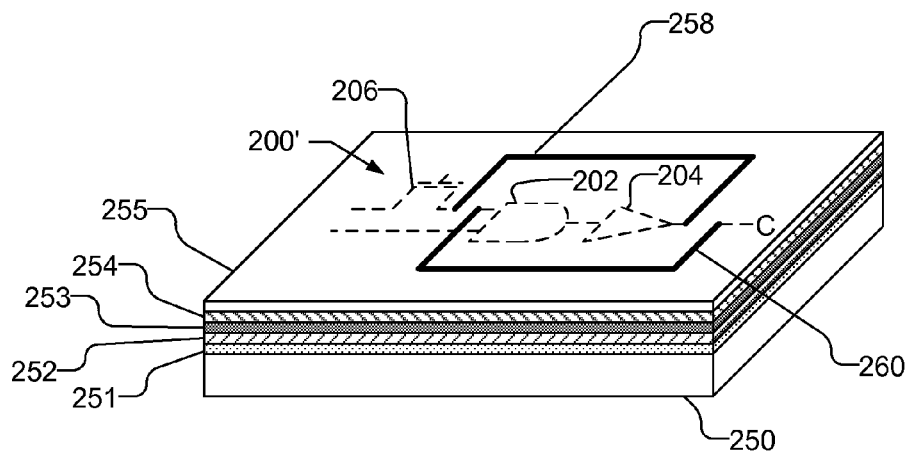
FIG. 5B is an illustration of a portion of an integrated circuit that includes the interface buffer circuit of FIG. 5A formed from a semiconductor chip covered with a plurality of patterned layers.

FIG. 5B illustrates is an illustration of a portion of an integrated circuit that includes the interface buffer circuit 200' similar to what is shown in FIG. 4B, except that the routing paths of the conductors are changed to reverse the connection of the interface buffer circuit. As shown in FIG. 5B, the routing path of conductor 258 in layer 255 is used to electrically connect the switch 206 to the output terminal of the buffer 204 and the routing path of conductor 230 is used to electrically connect the AND logic gate 202 to node C, which is connected to the dedicated device.

Thus, as can be seen by comparing FIGS. 4B and 5B, with a rearrangement of the routing paths of the conductors in one layer of the integrated circuit, the uni-directional interface buffer circuit can be used as either an input or an output interface for the dedicated device.

In addition, the switch 206 in buffer circuit 200 is used to isolate the dedicated device 104 and the programmable logic device 102, which operate at two different voltages. The switch 206 as a voltage isolation circuit that isolates the voltage domain of the dedicated device 104 from the voltage domain of the programmable logic device 102. By way of example, the programmable logic device 102 has a relatively high voltage (HV) domain, e.g., 3-10V, while the dedicated device 104 has a relatively low voltage (LV) domain, e.g., 1-2V. Thus, the switch 206 carries a high voltage (HV) at node B, which is connected to the programmable logic device 102, and carries a low voltage (LV) at node E, which is connected to the dedicated device 106 (node C) through AND logic gate 202 and buffer 204 as illustrated in FIGS. 4A and 5A. As can be seen in FIGS. 4A and 5A, the AND logic gate 202 and the buffer 204 operate at the same low voltage (LV) as the dedicated device 104. If desired, other types of voltage isolation circuits may be used in place of switch 206.

Figure 6A:
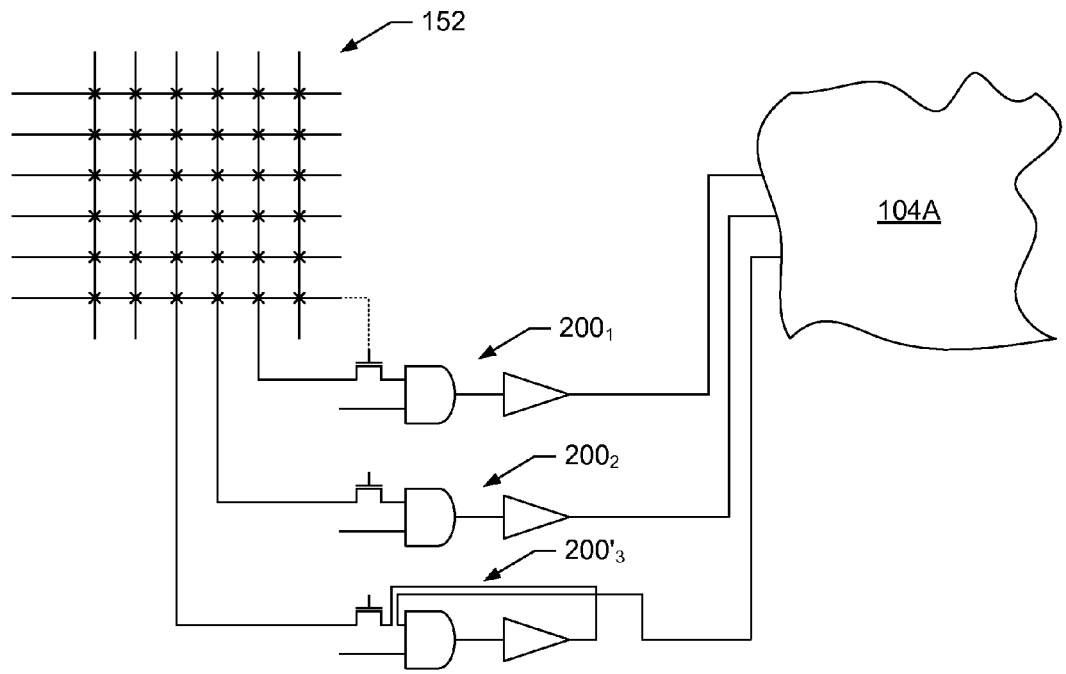
FIGS. 6A and 6B illustrate the interconnections between the programmable fabric of a programmable logic device and different dedicated devices using the mask programmable uni-directional interface buffer circuit.

FIG. 6A illustrates the interconnection between the programmable fabric 152 of a programmable logic device 102 and a dedicated device 104A. The interconnection is illustrated as three interface buffers, where two interface buffers $200_1$ and $200_2$ serve as an interface from the programmable fabric 152 to the dedicated device 104A, and the third interface buffer circuit $200'_3$ serves as the interface from the dedicated device 104A to the programmable fabric 152.

Figure 6B:
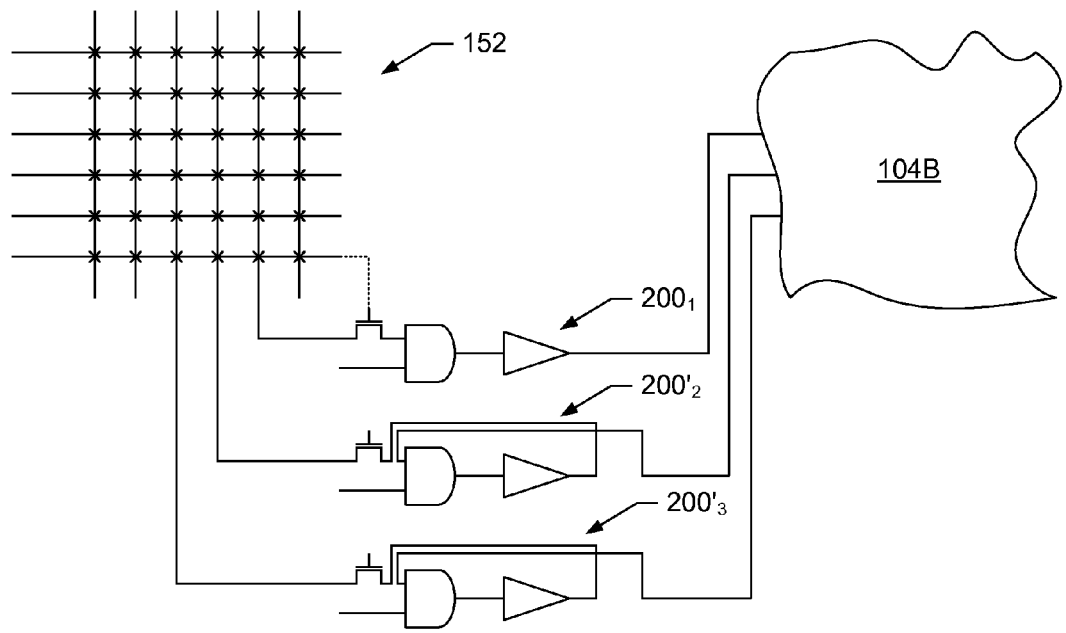

If a different dedicated device, which has a different requirement for the interface with the programmable logic device 102, is to be embedded in integrated circuit 100, the interface can be modified in a single layer during the semiconductor manufacturing process. For example, FIG. 6B is similar to FIG. 6A except FIG. 6B illustrates the interconnection with a different dedicated device 104B. The interconnection again has three interface buffers, where interface buffer circuit $200_1$ serves as an interface from the programmable fabric 152 to the dedicated device 104B and the third interface buffer circuit $200'_3$ serves as the interface from the dedicated device 104B to the programmable fabric 152. The second interface buffer circuit $200'_2$ shown in FIG. 6B, however, has its conductor path rerouted to serve as an interface from the dedicated device 104B to the programmable fabric 152.

Thus, as illustrated in FIGS. 4A, 4B, 5A, 5B, 6A, and 6B, the same interface buffer circuit can be used for both the input and output interface for a dedicated device, with a slight rearrangement of the routing of the conductors that occurs in a metal layer of the integrated circuit. Accordingly, the interface circuit 110 can be redesigned to alter the number of interface buffers that provide output signals from the dedicate device 104 to the programmable logic device 102 or that provide output signals from the programmable logic device 102 to the dedicate device 104 with one mask change during the manufacture of the semiconductor device. Reducing the complexity of the interface circuit 110 so that any subset of the interface buffer circuits may be used as the output from the dedicated device to the programmable logic device (or alternatively as the input to the dedicated device from the programmable logic device), with a single mask change decreases the redesign time and simplifies the manufacturing process.

Thus, during the design of an integrated circuit, in accordance with an embodiment of the present invention, the design of the programmable logic device 102 and the dedicated device 104 to be formed on a chip is selected. The design of the interface circuit 110 to be formed on the chip is also selected. The number of input interface connections to the dedicated device from the programmable logic device and the number of output interface connections from the dedicated device to the programmable logic device is determined. The routing of the conductors to be formed in a metal layer of the integrated circuit is then adjusted for a subset of the plurality of interface buffer circuits based on the determined number interconnections, as described above. It should be understood that the default interface circuit 110 design may have all conductors arranged so that the interface buffer circuits serve as input connections to the dedicated device (i.e., interface buffer circuits 200) or serve as output connections from the dedicated device (i.e., interface buffer circuits 200'), or a combination thereof.

Figure 7:
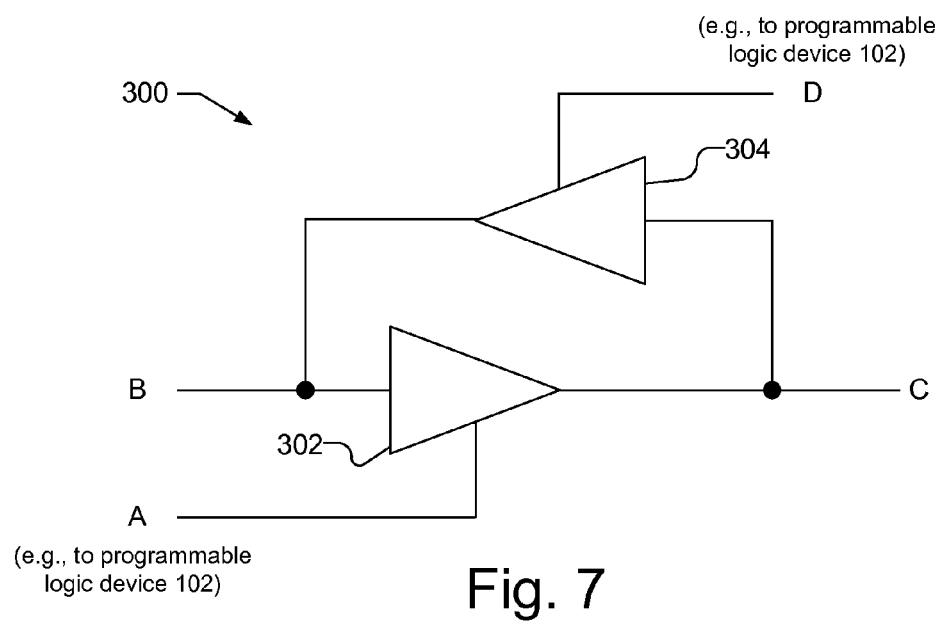
FIG. 7 illustrates a single hardware configurable bi-directional interface buffer circuit.

In another embodiment, the interface circuit 110 is implemented as a hardware configurable bi-directional interface buffer. FIG. 7 illustrates a single interface buffer circuit 300 in accordance with such an embodiment. It should be understood that the interface circuit 110 includes a plurality of interface buffer circuits 300.

Interface buffer circuit 300 includes two parallel and opposite oriented tri-stateable buffers 302 and 304. Thus, as shown in FIG. 7, the first tri-stateable buffer 302 includes an input terminal connected to the programmable logic device 102 at node B and an output terminal connected to the dedicated device 104 at node C. The second tri-stateable buffer 304 is arranged in the opposing direction, so that its input terminal is connected to the dedicated device 104 at node C and the output terminal is connected to the programmable logic device 102 at node B. The control terminals of tri-stateable buffers 302 and 304 are connected to nodes A and D, respectively, which may be, e.g., connected to the programmable logic device 102. During operation, the signals at nodes A and D are inverted so that only one of the two tri-stateable buffers 302 and 304 is on. Nodes A and D may be asserted, e.g., using an antifuse or other programmable element. Thus, once a plurality of bi-directional interface buffer circuits 300 are instantiated in the integrated circuit 100, there is no need to determine the number of interconnections to and from the programmable logic device and the dedicated device, nor is there a need to redesign the interface circuit 110 when a different dedicated device is embedded in the integrated circuit 100.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:
1. A method of manufacturing an integrated circuit, the method comprising:
    selecting a programmable logic device to be formed on a chip;
    selecting a dedicated device to be formed on the chip;
    selecting an interface circuit to be formed on the chip to provide the interface connections between the program- mable logic device and the dedicated device; the interface circuit comprising a plurality of interface buffer circuits;

determining a number of input interface connections to the dedicated device from the programmable logic device and a number of output interface connections from the dedicated device to the programmable logic device;

adjusting the routing of the conductors to be formed in a layer of the integrated circuit for a subset of the plurality of interface buffer circuits based on the determined number of at least one of the input interface connections and the output interface interconnects, wherein the subset of the plurality of interface buffer circuits is the same as the remainder of the plurality of interface buffer circuits except for the routing of the conductors.

2. The method of claim 1, wherein adjusting the routing of the conductors comprises selecting a mask based on the determined number of at least one of the input interface connections and the output interface interconnects to form the routing conductors.

3. The method of claim 1, wherein adjusting the routing of the conductors comprises is based on only the output interface interconnections.

4. The method of claim 1, wherein adjusting the routing of the conductors comprises is based on only the input interface interconnections.

5. The method of claim 1, further comprising forming the integrated circuit.

6. An integrated circuit comprising:
a programmable logic device;
a dedicated device; and
an interface coupled between the programmable logic device and the dedicated device, the interface comprising a plurality of programmable buffer circuits, each programmable buffer circuit comprising:
  a first tri-statable buffer having an input terminal coupled to the programmable logic device, a control terminal to turn the first tri-statable buffer on or off, and an output terminal coupled to the dedicated device; and
  a second tri-statable buffer having an input terminal coupled to the output terminal of the first tri-statable buffer, a control terminal to turn the second tri-statable buffer on or off, and an output terminal coupled to the input terminal of the first tri-statable buffer;
wherein the plurality of programmable buffer circuits are programmable by one or more programmable elements coupled to the control terminal of the first tri-statable buffer and the control terminal of the second tri-statable buffer.

7. An integrated circuit comprising:
a programmable logic device;
a dedicated device; and
an interface coupled between the programmable logic device and the dedicated device, the interface comprising a plurality of programmable buffer circuits, each programmable buffer circuit comprising:
  a first tri-statable buffer having an input terminal coupled to the programmable logic device, a control terminal to turn the first tri-statable buffer on or off, and an output terminal coupled to the dedicated device; and
  a second tri-statable buffer having an input terminal directly connected to the output terminal of the first tri-statable buffer, a control terminal to turn the second tri-statable buffer on or off, and an output terminal directly connected to the input terminal of the first tri-statable buffer.

* * * * *